United States Patent [19]

Europa et al.

[11] Patent Number: 5,923,232

[45] Date of Patent: Jul. 13, 1999

[54] MECHANISM FOR ELIMINATION OF CORONA EFFECT IN HIGH POWER RF CIRCUITRY AT EXTENDED ALTITUDES

[75] Inventors: Thomas M. Europa; Mark D. Smith, both of Glendale, Ariz.

[73] Assignee: Honeywell Inc., Minneapolis, Minn.

[21] Appl. No.: 08/893,468

[22] Filed: Jul. 11, 1997

[51] Int. Cl.$^6$ .............................. H01P 1/203; H05K 1/00
[52] U.S. Cl. ...................... 333/204; 333/246; 361/751; 361/748
[58] Field of Search .................................. 333/204, 205, 333/238, 246, 202; 361/748, 749, 751

[56] References Cited

U.S. PATENT DOCUMENTS

| | | | |
|---|---|---|---|
| 3,725,941 | 4/1973 | Stang | 343/708 |
| 3,754,198 | 8/1973 | Anghel | 333/204 |
| 4,706,050 | 11/1987 | Andrews | 333/204 X |
| 5,450,286 | 9/1995 | Jacques et al. | 361/749 |
| 5,682,674 | 11/1997 | Yamazaki et al. | 333/205 X |

*Primary Examiner*—Seungsook Ham
*Attorney, Agent, or Firm*—Snell & Wilmer LLP

[57] ABSTRACT

An improved electrical circuit particularly adapted to operate in an extremely thin atmosphere such as above fifty thousand feet. The circuitry of the invention is preferably formed on a circuit board and has an exposed conductive element such as a harmonic filter. This exposed conductive element is encased by a thin dielectric which is preferably formed using a solder mask having dielectric properties which prevent the conductive element from creating a corona during electrical operation in the contemplated thin atmosphere. In the preferred embodiment, the solder mask has a thickness of less than 0.002 inches and exhibits a dielectric strength of at least 1000 V/0.001 inch. The solder mask, for the preferred embodiment, is positioned to cover the conductive element and extends onto the circuit board only minimally.

23 Claims, 3 Drawing Sheets

MECHANISM FOR ELIMINATION OF CORONA EFFECT IN HIGH POWER RF CIRCUITRY AT EXTENDED ALTITUDES

BACKGROUND OF THE INVENTION

This invention relates to circuitry for the performance of Traffic Alert/Collision Avoidance Systems ("TCAS") commonly used in the aerospace industry, and more particularly to TCAS systems which are used in altitudes greater than fifty thousand feet.

Within the present discussion, the invention's attributes are described relative to the TCAS, but, the invention is not so limited and is intended to be applied to circuits which are to operate in very thin atmospheres.

TCAS is a high power pulsed radio frequency (RF) system with a transmit frequency of 1030 MHz. Internally, power levels can approach 1200 W.

Using the formula $$V_{rms} = \sqrt{PZ}$$

where $V_{rms}$ is the root mean square RF voltage, P is the power level, and Z is the impedance presented at that location, a 1200 W power input equates to 245 $V_{rms}$ across 50 Ω impedance. The voltage levels can become much higher in areas of high impedance, resonant structures or where an impedance mismatch occurs.

Two phenomena which can be detrimental to high power systems are voltage breakdown (arcing) and corona. Voltage breakdown occurs when the applied voltage exceeds the breakdown voltage of the medium and essentially a short circuit is formed between the points across which the voltage is applied. This is generally a destructive failure mechanism which can result in charring of material and even can result in permanent short circuits.

Corona simply represents the ionization of a gas surrounding the point of high voltage. The gas usually is air, and corona results in a spectacular colorful discharge. Corona usually precedes arcing. The occurrence of corona can diminish the transmitted power level and as well can be an indicator of more significant problems at more extreme environmental conditions.

The existing art provides general improvements for reducing voltage breakdown and include such techniques as:

a) decreasing the applied voltage (by decreasing the impedance);
b) increasing the separation between the points across which the voltage is applied;
c) eliminating all sharp corners and transitions; and,
d) eliminating all air gaps.

Generally all these improvements apply to reducing corona also, except that corona often occurs in open air instead of between two electrodes.

In a particular RF filter used to reduce harmonic output in a TCAS system, a susceptibility to corona has been noted. This filter is a distributed element filter in a microstrip design, meaning that the elements (inductance and capacitance) are printed in copper on a substrate. This filter is very sensitive to dimensional repeatability of the copper image and the material as well as the material properties like dielectric constant and loss tangent.

Unfortunately, the improvements listed above do not seem practical in the design of the TCAS filter. Decreasing the impedance implies larger microstrip circuitry, and circuit space is at a premium, plus the coupling to adjacent traces increases as the traces get closer, resulting in an electrical performance degradation. To achieve the necessary distributed element value for capacitance or inductance requires microstrip stubs of particular width and length, many of which are narrow lines with an abrupt end.

One way to eliminate all air would be to bury the circuit in a stripline assembly which surrounds the circuit with dielectric material. Although this is feasible, it makes the microstrip launch into the filter between layers much more difficult. Further, in the construction lay-up of this particular PWB, the filter becomes more lossy by the inclusion of FR4 material in the stripline assembly.

Also since the circuit is so large, the stripline method would use much valuable internal space otherwise reserved for interconnects.

Another option is to cover the filter with another layer of PTFE dielectric, called dielectric overlay. Dielectric overlay is difficult to model when using even the thinnest layers of PWB material, and the additional dielectric will significantly alter the performance of the filter.

Although corona is not a new problem, corona in high power RF circuitry used at high altitude (in excess of fifty thousand feet up to seventy thousand feet) has not been fully addressed. In this context, corona began to exist intermittently at 55,000 ft, at an input power level of 750 W.

It is clear that there is a need for circuitry which can operate in thin atmospheres without generating a corona or short circuits.

SUMMARY OF THE INVENTION

The present invention creates an improved electrical circuit particularly adapted to operate in an extremely thin atmosphere such as above fifty thousand feet. The circuitry of this invention is adapted to work in rarefied atmospheres through the elimination of coronas and short circuits.

While the present discussion contemplates the application of the circuitry to an aircraft operating above fifty thousand feet, the invention is not so limited as there are several applications, obvious to those of ordinary skill in the art, which utilize thin atmospheres surrounding circuitry.

The circuitry of the invention is preferably formed on a circuit board and has an exposed conductive element such as a harmonic filter. A harmonic filter is tuned to suppress undesired harmonics within a circuit. In the preferred application, the harmonic filter is used in a TCAS.

This exposed conductive element is encased by a thin dielectric which is formed using a solder mask having dielectric properties which prevent the conductive element from forming a corona above the element in the thin atmosphere. The solder mask encases the conductive element, such as the harmonic filter, so that the thin ambient air is prevented from directly contacting the conductive element.

Further, the solder mask exhibits dielectric properties so that electrons from the conductive element are prevented from escaping directly into the thin atmosphere and forming a corona or shorting to other elements within the circuit.

In the preferred embodiment, the solder mask has a thickness of less than 0.002 inches and exhibits a dielectric strength of at least 1000 V/0.001 inch. These attributes have been found to prevent coronas and short circuits within atmospheres analogous with an altitude of fifty thousand feet.

The solder mask, for the preferred embodiment, is positioned to cover only the conductive element and extends onto the circuit board only minimally. The solder mask is slightly enlarged beyond the size of the conductive element to ensure that the conductive element is covered even if slight misregistration occurs between the solder mask and the conductive element. With an overlap of less than 0.005 inches the risk of peeling of the solder mask is minimized.

With regard to the contemplated use of this invention, the TCAS system is to be fully functional at 55,000 ft and over a temperature range of −55 to +70 degrees Celsius. This capability is far in excess of the present ceiling of fifteen thousand feet.

The present invention significantly increases the maximum altitude at which the TCAS harmonic filter functions reliably without corona or voltage breakdown, and with no degradation in performance.

Perhaps of equal importance, the improvement this invention establishes is made with virtually no increase in cost and no increase in hand labor.

In particular, the invention consists of using solder mask as an automatically and consistently applied conformal coat with the purpose of eliminating corona and voltage breakdown throughout the required altitude range. Solder mask is commonly applied to the PWB during manufacture of the PWB; hence, solder mask is applied at the same time on the filter as the other necessary areas.

Solder mask is commonly used on PWBs and has been proven to adhere well to copper. Ideally, the registration of the solder mask is controlled such that it extends less than 0.005 inches onto the PTFE, minimizing the risk of peeling.

Preferably, the solder mask thickness is both consistent and thin. The thickness is typically less than 0.002 inches. Although the solder mask still provides a dielectric overlay which is difficult to model, the consistency and minimal thickness of the solder mask causes minimal effect in the performance. The preferred solder masks are liquid photo-imageable (LPI) and generally have dielectric strengths greater than 1000 V/0.001 inch.

The effect of the solder mask is to offer a capacitance between the circuit and the thin ambient air. This capacitance causes some of the voltage to be applied across the solder mask, effectively decreasing the voltage exposed to the air.

Assuming that the formula for capacitance in this case remains $C=\epsilon A/d$ where $\epsilon$ is the dielectric constant of the solder mask, A is the surface area of the solder mask, and d is the thickness of the solder mask, the capacitance then is proportional to the dielectric constant of the solder mask which is approximately 3.5–4.0 (similar to FR4).

The invention, together with various embodiments thereof, will be more fully explained by the accompanying drawings and the following description.

DRAWINGS IN SUMMARY

DRAWINGS IN DETAIL

Figure 1:
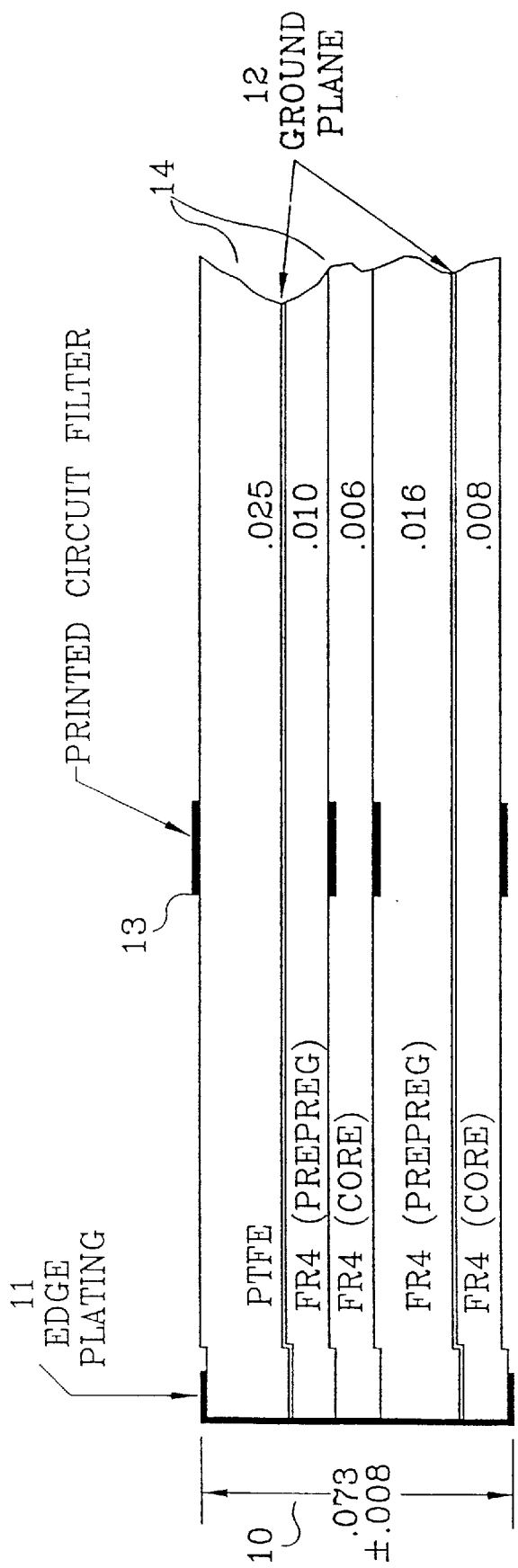
FIG. 1 is a side view of an embodiment of a circuit board incorporating an embodiment of the invention.

FIG. 1 is a side view of an embodiment of a circuit board incorporating an embodiment of the invention.

Circuit board 10 is typical of many circuit boards having multiple layers 14 with intermixed ground planes 12 and an edge plating 11. Circuit board 10 has formed on one face, printed circuit filter 13 which has been encased with the dried dielectric liquid (not shown).

During operation, the dried dielectric liquid forms a barrier to the formation of a corona above printed circuit filter 13. Since printed circuit filter 13 is incapable of forming a corona, the device is able to operate without corona induced damage.

Figure 2:
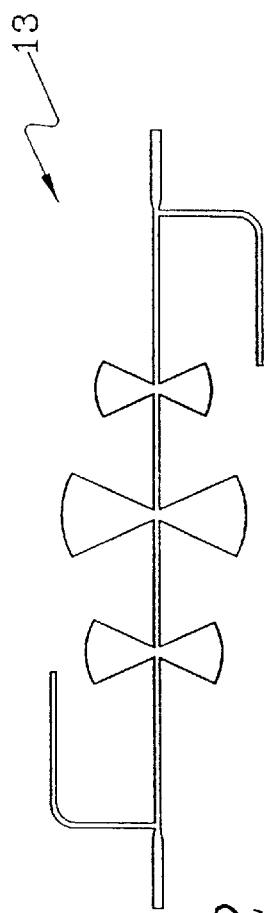
FIG. 2 is a top view of the preferred harmonic filter which is incorporated into the circuit board of FIG. 1.

FIG. 2 is a top view of the preferred harmonic filter which is incorporated into the circuit board of FIG. 1.

While a variety of exposed circuits are contemplated by this invention, the harmonic filter structure 13 is the preferred structure. Harmonic filter 13 is useful in the TCAS system discussed earlier. With harmonic filter 13 coated with the dried dielectric liquid, harmonic filter 13 is able to perform even in rarefied atmospheres within the range of fifty thousand to seventy five thousand feet.

Those of ordinary skill in the art recognize a variety of other exposed circuitry which will benefit by the encasement within a dried dielectric liquid.

Figure 3:
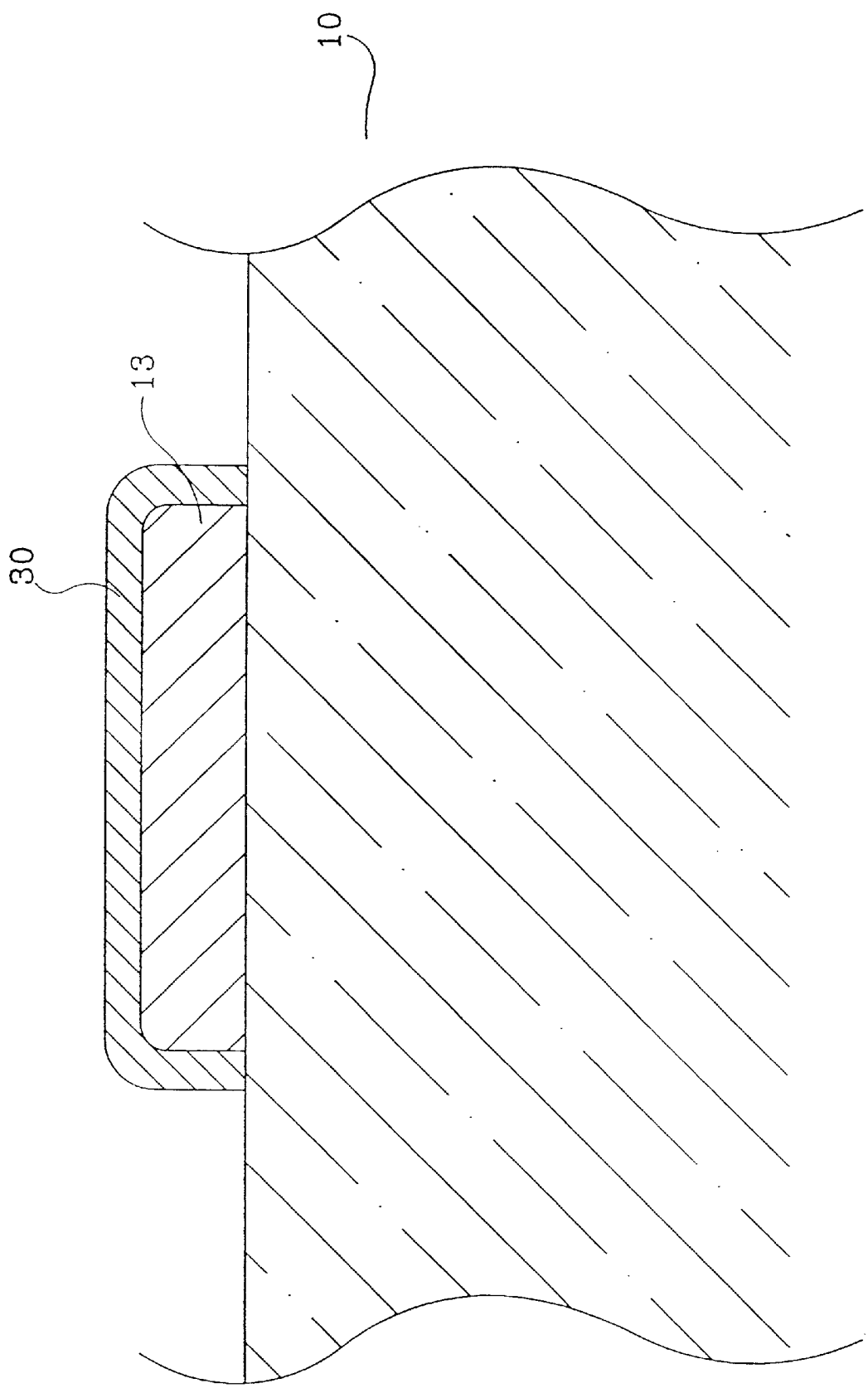
FIG. 3 is a close-up side view of the harmonic filter of FIG. 2 illustrating the encapsulation of the harmonic filter using the dried dielectric liquid.

FIG. 3 is a close-up side view of the harmonic filter of FIG. 2 illustrating the encapsulation of the harmonic filter using the dried dielectric liquid.

As illustrated in FIG. 1, circuit board 10 has printed circuit filter 13. Dried dielectric liquid 30 forms an encasement over the printed circuit filter 13 and has sufficient dielectric properties to prevent the formation of a corona over filter 13 during its operation at a chosen altitude.

In the preferred embodiment, dried dielectric liquid 30 is a solder mask which has been consistently applied to form a uniform coat over filter 13. In the liquid state, the solder mask is ideally applied to the filter and circuit board during manufacture of the circuit board and then dried using techniques well known to those of ordinary skill in the art.

The ideal solder mask adheres well to copper or the chosen material of filter 13. Registration of the solder mask is controlled such that it extends less than 0.005 inches onto the face of the circuit board. This minimal extension minimizes the risk of peeling.

In the preferred embodiment, the solder mask thickness is controlled to be both consistent and thin (less than 0.002 inches thick). Through the use of minimal thickness, little discernable perturbation is made on the performance of filter 13. The preferred solder mask is liquid photo-imageable (LPI) and has a dielectric strength greater than 1000 V/0.001 inch.

The capacitance created by the solder mask between the circuit and the thin ambient air effectively decreases the voltage exposed to the air; thereby reducing any potential corona creation.

Figure 4:
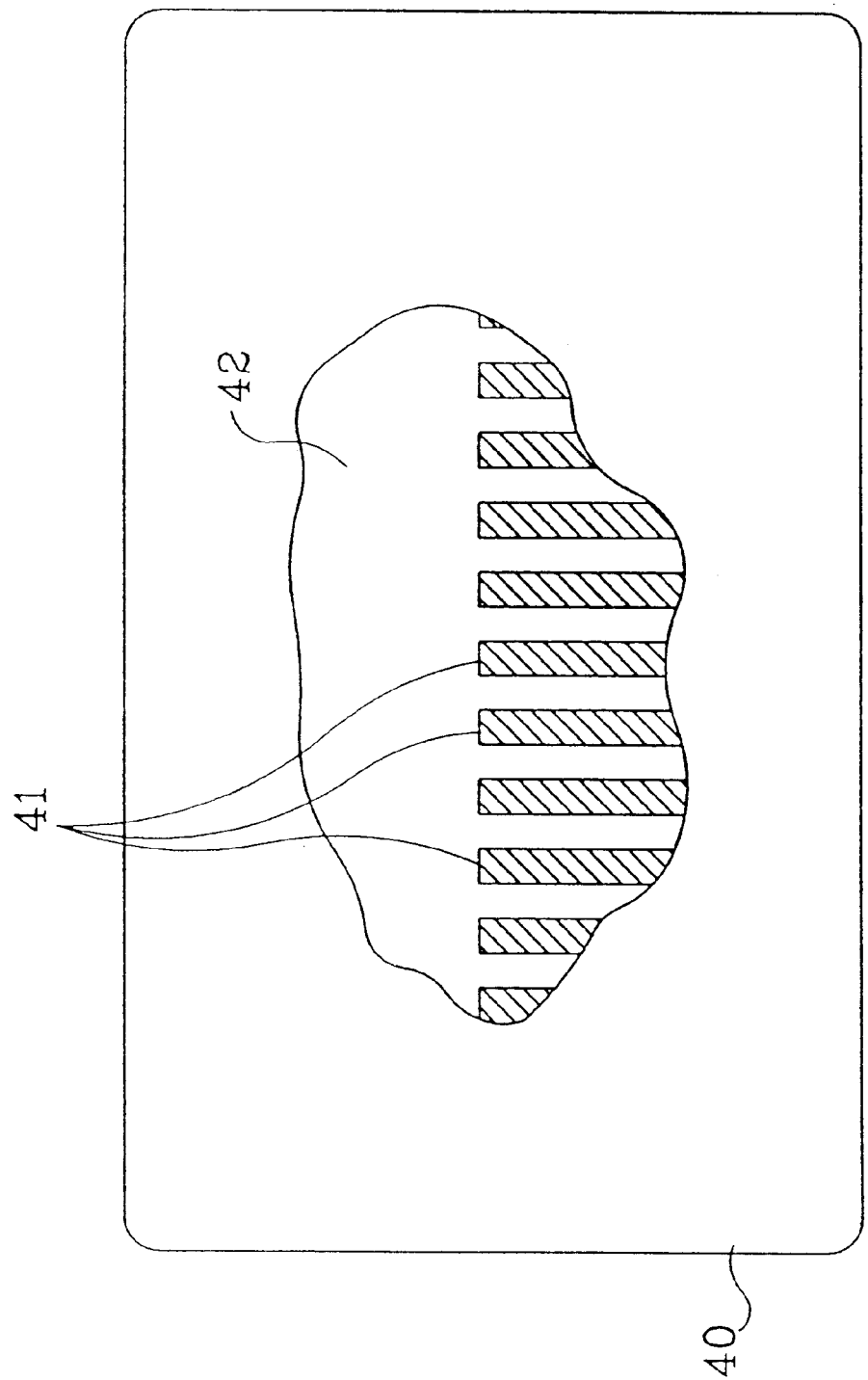
FIG. 4 is a side view of an embodiment of the invention in which multiple circuit boards are encased within a housing having an internal pressure equivalent to an altitude of fifty thousand feet.

FIG. 4 is a side view of an embodiment of the invention in which multiple circuit boards are encased within a housing having an internal pressure equivalent to an altitude of greater than fifty thousand feet.

In some applications of this invention, the circuit boards 41, treated as described above, are housed within housing 40. The atmospheric pressure 42 on circuit boards 41 is equivalent to that of the chosen range (equivalent to an altitude of greater than fifty thousand feet). Exposed circuits on circuit boards 41 have been treated and encased with the dried dielectric layer so that corona creation is minimized.

It is clear that the present invention creates a highly effective circuit which avoids the creation of short circuits and coronas even at minimal ambient air pressure.

What is claimed is:

1. An electronic package having an electrical circuit mounted on a circuit board which operates at high altitudes with substantially reduced corona effects, said circuit comprising:
   a) at least one conductive element exposed on a face of said circuit board; and
   b) a dried dielectric liquid covering secured to said at least one conductive element for reducing said corona effects at high altitudes while minimizing performance degradation of said electrical circuit.

2. The electrical circuit according to claim 1 wherein said dried dielectric liquid covering includes a solder mask.

3. The electrical circuit according to claim 2 wherein said solder mask is a liquid photo-imageable solder mask.

4. The electrical circuit according to claim 1 wherein said dried dielectric liquid covering has a thickness of less than 0.002 inches to facilitate the reduction of said corona effects while minimizing performance degradation of said electrical circuit.

5. The electrical circuit according to claim 4 wherein said dried dielectric liquid covering has a dielectric strength of at least 1000 V/0.001 inch to facilitate the reduction of said corona effects.

6. The electrical circuit according to claim 1 wherein said at least one conductive element includes a harmonic filter.

7. The electrical circuit according to claim 4 wherein said dried dielectric liquid covering is substantially restrained from the face of said circuit board such that said dried dielectric covering extends less than 0.005 inches onto the face of said circuit board and minimizes the risk of said covering peeling from said conductive element.

8. An electrically conductive circuit board having minimal corona effects attributable to high altitudes, comprising:
   at least one conductive element encased by a dried liquid dielectric, said dried liquid dielectric substantially eliminating said corona effects while minimizing performance degradation of said circuit board.

9. The circuit board according to claim 8 wherein said dried liquid dielectric covering includes a solder mask.

10. The circuit board according to claim 9 wherein said solder mask is a liquid photo-imageable solder mask.

11. The circuit board according to claim 10 wherein said solder mask has a dielectric strength of at least 1000 V/0.001 inch and a thickness of less than 0.002 inches to facilitate the reduction of said corona effects while minimizing performance degradation of said circuit board.

12. The circuit board according to claim 11 wherein said solder mask is substantially constrained to said conductive element such that said solder mask extends less than 0.005 inches onto a face of said circuit board to minimize the risk of said solder mask peeling from said conductive element.

13. The circuit board according to claim 12 wherein said at least one conductive element includes a harmonic filter.

14. An electrical apparatus which substantially eliminate corona effects occurring at high altitudes, said electrical apparatus comprising:
   a) a housing unit;
   b) at least one circuit board within said housing unit having;
      1) at least one harmonic filter exposed on a face of one of said at least one circuit board, and
      2) a dried dielectric liquid encasing said at least one harmonic filter; and
   c) an atmosphere within said housing unit having a pressure substantially similar to an atmosphere at an altitude of at least fifty thousand feet.

15. The electrical apparatus according to claim 14 wherein said dried dielectric liquid includes a solder mask.

16. The electrical apparatus according to claim 15 wherein said solder mask is a liquid photo-imageable solder mask.

17. The electrical apparatus according to claim 16 wherein said dried dielectric liquid has a dielectric strength of at least 1000 V/0.001 inch and a thickness of less than 0.002 inches to facilitate the elimination of said corona effects while minimizing degradation of performance of said electrical apparatus.

18. An electrical apparatus for use at high altitudes, said electrical apparatus substantially eliminating corona effects produced at said high altitudes, said electrical apparatus comprising:
   a) an electrical circuit board;
   b) a harmonic filter formed on a face of said circuit board; and
   c) a dielectric covering formed initially as a liquid over said harmonic filter, said dielectric covering forming a capacitance layer sufficient that at a given voltage within said harmonic filter and at a given ambient atmospheric pressure, said harmonic filter is incapable of creating said corona effects above said dielectric covering.

19. The electrical apparatus according to claim 18 wherein said dielectric covering has a dielectric strength of at least 1000 V/0.001 inch and a thickness of less than 0.002 inches to prevent the creation of said corona effect above said dielectric covering without substantially degrading performance of said electrical apparatus.

20. The electrical apparatus according to claim 18 wherein said dielectric covering includes a dried liquid photo-imageable solder mask.

21. The electrical apparatus according to claim 18, wherein said harmonic filter includes distributed microstrip elements.

22. A method for substantially eliminating corona effects of a circuit board used at high altitudes such that said circuit board operates efficiently at said high altitudes, comprising the steps of:
   a) providing a circuit board having at least one conductive element exposed on a face of said circuit board;
   b) applying a dielectric liquid covering to said at least one conductive element to in a manner to reduce the effects of corona on said circuit board occurring at said high altitudes while minimizing performance degradation of said circuit board.

23. A method according to claim 22, wherein said step of applying a dielectric liquid covering further comprises:
   1) selecting a solder mask having a dielectric strength of at least 1000 V/0.001 inch;
   2) applying said solder mask to cover said at least one conductive element such that said solder mask comprises a consistently uniform thickness of less than 0.002 inches to substantially eliminate the corona effects while minimizing the performance degradation of said circuit board; and
   3) applying said solder mask to said at least one conductive element such that said solder mask is substantially restrained from the face of said circuit board, said solder mask covering less than 0.005 inches of the face of said circuit board to minimize the risk of said solder mask peeling from said at least one conductive element.

* * * * *